(12) United States Patent
Farber et al.

(10) Patent No.: US 7,745,337 B2
(45) Date of Patent: Jun. 29, 2010

(54) METHOD OF OPTIMIZING SIDEWALL SPACER SIZE FOR SILICIDE PROXIMITY WITH IN-SITU CLEAN

(75) Inventors: David G. Farber, Austin, TX (US); Fred Hause, Austin, TX (US); Markus Lenski, Dresden (DE); Anthony C. Mowry, Buda, TX (US)

(73) Assignee: Globalfoundries Inc., Grand Cayman (KY)

( * ) Notice: Subject to any disclaimer, the term of this patent is extended or adjusted under 35 U.S.C. 154(b) by 103 days.

(21) Appl. No.: 12/122,840

(22) Filed: May 19, 2008

(65) Prior Publication Data

US 2009/0286389 A1 Nov. 19, 2009

(51) Int. Cl.
*H01L 21/311* (2006.01)

(52) U.S. Cl. .......... 438/696; 438/704; 257/E21.224; 257/E21.226; 257/E21.256

(58) Field of Classification Search ........... 438/757, 438/906, 704, 696; 257/E21.49, E21.224, 257/E21.226, E21.227, E21.255, E21.256
See application file for complete search history.

(56) References Cited

U.S. PATENT DOCUMENTS

| 7,223,647 | B2 * | 5/2007 | Hsu et al. | 438/199 |
| 7,537,988 | B2 * | 5/2009 | Ekbote et al. | 438/199 |
| 2003/0087512 | A1 * | 5/2003 | Cheong | 438/595 |
| 2005/0101093 | A1 * | 5/2005 | Cheng et al. | 438/303 |
| 2006/0099745 | A1 * | 5/2006 | Hsu et al. | 438/149 |
| 2008/0145797 | A1 * | 6/2008 | Verbeke et al. | 430/322 |
| 2008/0188014 | A1 * | 8/2008 | Amos et al. | 438/8 |
| 2009/0004850 | A1 * | 1/2009 | Ganguli et al. | 438/655 |
| 2009/0098695 | A1 * | 4/2009 | Ekbote et al. | 438/231 |

* cited by examiner

*Primary Examiner*—Caridad M Everhart
(74) *Attorney, Agent, or Firm*—Ditthavong, Mori & Steiner, P.C.

(57) ABSTRACT

A method that includes forming a gate of a semiconductor device on a substrate, and etching sidewall spacers on sides of the gate to provide a proximity value, where the proximity value is defined as a distance between the gate and an edge of a performance-enhancing region. The sidewall spacers are used to define the edge of the region during formation of the region in the substrate. The method also includes pre-cleaning the gate and the substrate in preparation for formation of the region, where the etching and the pre-cleaning are performed in a continuous vacuum.

26 Claims, 11 Drawing Sheets

METHOD OF OPTIMIZING SIDEWALL SPACER SIZE FOR SILICIDE PROXIMITY WITH IN-SITU CLEAN

BACKGROUND OF THE INVENTION

1. Field of the Invention

The present invention relates to the formation of integrated circuits, and, more particularly, to the formation of field effect transistors having a channel region with a specified intrinsic stress to improve the charge carrier mobility.

2. Discussion of the Background

Integrated circuits are formed of a large number of individual circuit elements, such as transistors, capacitors, resistors, etc. These elements are connected internally to form complex circuits, such as memory devices, logic devices and microprocessors. The performance of integrated circuits can be improved by increasing the number of functional elements in the circuit in order to increase its functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Metal-oxide-semiconductor field-effect transistors (MOSFETs, or FETs) are used as switching elements in integrated circuits. FETs allow control of a current flowing through a channel region located between a source region and a drain region. The source region and the drain region are highly doped. In N-type transistors (or NFETs, or NMOSs), the source and drain regions are doped with an N-type dopant. Conversely, in P-type transistors (or PFETs, or PMOSs), the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

When reducing the size of FETs, it is important to maintain a high conductivity of the channel region in the "on" state. The conductivity of the channel region in the "on" state depends on the dopant concentration in the channel region, the mobility of the charge carriers, the extension of the channel region in the width direction of the transistor and the distance between the source region and the drain region, which is commonly denoted as "channel length." While a reduction of the width of the channel region leads to a decrease of the channel conductivity, a reduction of the channel length enhances the channel conductivity. However, further reduction of the channel length entails a plurality of obstacles associated therewith, for example, relating to the reliability and reproducibility of advanced techniques of photolithography and etching needed to create such transistors having short channel lengths.

In view of the problems associated with a further reduction of the channel length, it has been proposed to also enhance the performance of field effect transistors by increasing the charge carrier mobility in the channel region. One approach that may be used to increase the charge carrier mobility involves modifying the lattice structure in the channel region by creating tensile or compressive stress. This leads to a modified mobility of electrons and holes, respectively. A tensile stress in the channel region increases the mobility of electrons. When applied in a longitudinal direction (i.e., in the direction of current flow), tensile stress can enhance electron mobility (or n-channel FET drive currents), while compressive stress can enhance hole mobility (or p-channel FET drive currents).

Several methods of forming FETs having stressed channel regions have been proposed. In one such method, a layer including an alloy of silicon and germanium or an alloy of silicon and carbon, respectively, is introduced into (or below) the channel region in order to create a tensile or compressive stress, as discussed in U.S. Pat. No. 7,157,374 and U.S. Pub. No. 2007/0207583. In another such method, the stresses are placed on the channel regions through the use of intrinsically-stressed barrier dielectric layers (e.g., silicon nitride layers) formed over the transistors, as discussed in U.S. Pub. No. 2007/0007552 and U.S. Pub. No. 2007/0207583.

However, one problem typically associated with the implementation of such methods of forming field effect transistors having stressed channel regions is that the formation of the stress-creating structure requires considerable modification of conventional and well-approved techniques used for the formation of FETs. Thus, the complexity of the formation of the transistors is significantly increased compared to the formation of transistors without stress-creating structures. Thus, a need exists for a method allowing the creation of desired stress conditions in a FET without requiring substantial modifications to the manufacturing process.

SUMMARY OF THE INVENTION

The present invention advantageously provides embodiments of a method that includes forming a gate of a semiconductor device on a substrate, and etching sidewall spacers on sides of the gate to provide a proximity value, where the proximity value is defined as a distance between the gate and an edge of a performance-enhancing region. The sidewall spacers are used to define the edge of the region during formation of the region in the substrate. The method also includes pre-cleaning the gate and the substrate in preparation for formation of the region, where the etching and the pre-cleaning are performed in a continuous vacuum.

The present invention further advantageously provides embodiments of a method that includes forming a gate of a semiconductor device on a substrate, reducing sizes of sidewall spacers on sides of the gate within a process module, performing a pre-silicide clean of the gate and the substrate within the process module, and forming silicide regions in the substrate. The sidewall spacers are used to define edges of the silicide regions. And, the reducing of sizes of the sidewall spacers and the performing of the pre-silicide clean are performed in a continuous vacuum in the process module.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which:

2B is a cross-sectional view of the gate structure of the FET device of FIG. 2A after the silicidation process;

FIGS. 4A and 4B depict erosion of n-type polysilicon at a location near an n/p junction caused by an HFEG wet etch, where FIG. 4A depicts a cross-sectional view of the n-type polysilicon along line IVA-IVA in FIG. 4B, which is a top plan view of the n/p junction;

FIGS. 5A-5C are cross-sectional view of gate structures of FET devices after a wet etch in an HFEG bath showing a variation in etch rate with bath age, where FIG. 5A depicts a post-HFEG gate structure when the age of the HFEG bath is low, FIG. 5B depicts a subsequent post-HFEG gate structure when the age of the HFEG bath has increased, and FIG. 5C depicts a further subsequent post-HFEG gate structure when the age of the HFEG bath has further increased;

DETAILED DESCRIPTION OF EMBODIMENTS OF THE INVENTION

Embodiments of the present invention will be described hereinafter with reference to the accompanying drawings. In the following description, the constituent elements having substantially the same function and arrangement are denoted by the same reference numerals, and repetitive descriptions will be made only when necessary.

As noted above, the formation of FETs with stressed channel regions can enhance the performance of the FET. Similar to the methods discussed in the Discussion of the Background, silicide regions can be formed in the source and drain regions alternatively or in conjunction with the other methods to increase the FET device performance due to silicide stress effects. In order to enhance device performance, a distance between the silicide regions and the gate electrode, which will be referred to herein as "proximity" should be kept to a minimum thereby reducing the electrical series resistance between the silicide and the edge of the channel of the FET, and provide optimal performance enhancing benefits.

During the manufacture of FET devices, a plurality of FETs, which can include one or more PFETs, one or more NFETs, or any combination thereof, are be formed on a substrate. If one or more of the FETs on the substrate are going to be provided with such silicide regions, then the substrate can be sent to a module that prepares the FETs for the silicidation process, for example, by performing a pre-silicide cleaning and depositing of material used to form the silicide region. However, as noted above, the proximity of the silicide region to the gate electrode effects the performance enhancement of the FET, and therefore a method can be used prior to the silicidation process to achieve a more optimal proximity value for the FET.

Figure 1A:
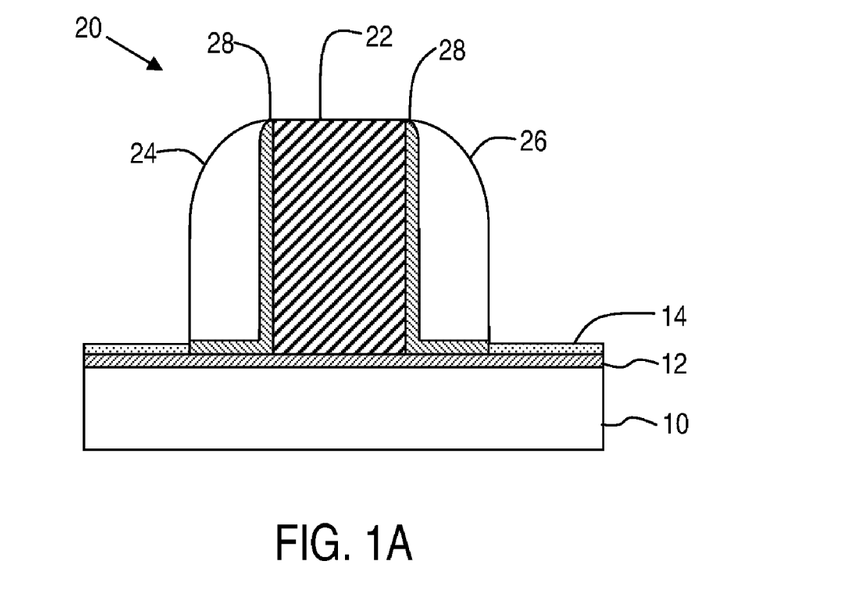
FIG. 1A is a cross-sectional view of a standard gate structure of a field-effect transistor (FET) device prior to a silicidation process.
Figure 1B:
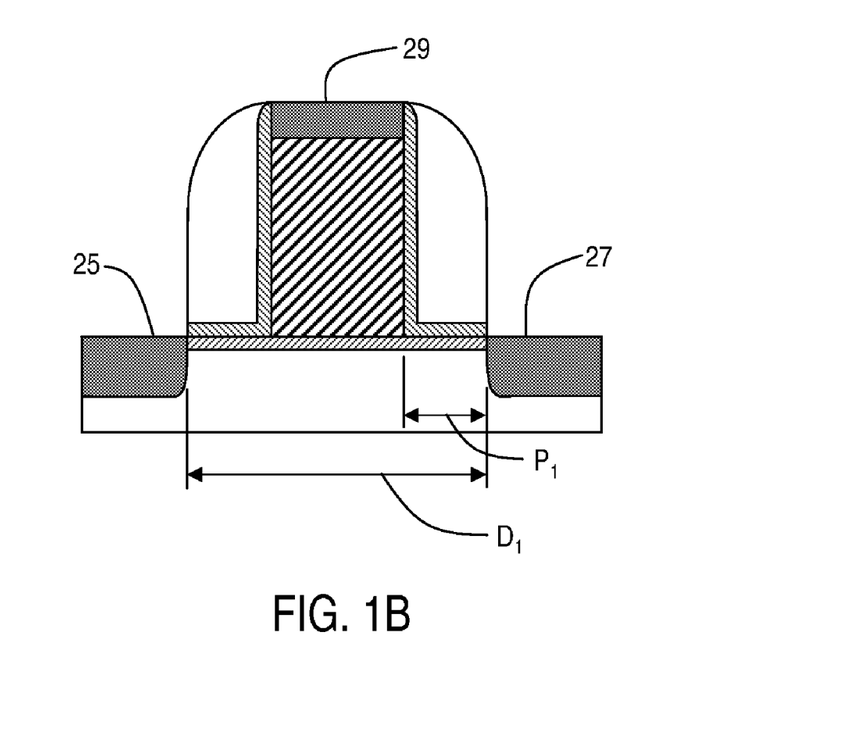
FIG. 1B is a cross-sectional view of the gate structure of the FET device of FIG. 1A after the silicidation process.

FIG. 1A depicts a gate structure of an FET device prior to the silicidation process, and FIG. 1B depicts the FET device after the silicidation process. The gate structure depicted in FIG. 1A represents a standard gate structure at a stage of the manufacturing process, which could then be further processed in a variety of manners. FIG. 1A depicts a substrate 10, and a first transistor element 20, which could be formed as either a PFET or NFET. The substrate 10 beneath the first transistor element 20 is an active region, which can later be formed into a source region and a drain region with a channel region therebetween. A gate insulation layer 12 is provided on the substrate 10 in between the substrate and a gate electrode 22 formed of polysilicon. Sidewall spacers 24, 26, which can be formed of nitride or silicon nitride, are formed adjacent the gate electrode 22, and a liner oxide 28 can be provided in between the gate electrode 22 and the sidewall spacers 24, 26. Additionally, an oxide layer 14 may grow during transportation of the gate structure of the FET device between manufacturing stages.

In a situation where a silicidation process is performed on the standard gate structure of FIG. 1A, the sidewall spacers 24, 26 will act as a mask to define an inner edge of silicide regions 25, 27 during the silicidation process. In one example of such a manufacturing process, the gate structure of FIG. 1A will be transported to a cleaning and depositing system to prepare the gate structure for silicidation. The cleaning and depositing system is maintained under a state of vacuum. When an incoming wafer (or stack) including the gate structure is provided within the cleaning and depositing system, a pre-cleaning process is performed, and then a layer of metal used in the silicidation process (e.g., nickel) is deposited on top of the gate electrode 22 and the substrate 10. Then, a rapid thermal annealing process is performed on the gate structure to form the silicide regions 25, 27 and a silicide cap 29 on the top of the gate electrode.

As can be seen in FIG. 1B, the silicidation process performed on such a standard gate structure will formed silicide regions 25, 27 that are separated by a distance $D_1$. Further, the silicide regions 25, 27 formed in this manner have a proximity value (i.e., the distance from the inner edge of the silicide region to the gate electrode) $P_1$. (Note that, during the formation of the silicide regions, which is a metallurgical combination of silicon and metal (e.g., nickel), a volume reduction can be observed such that an original top surface of the silicon is now lower or recessed (which is not depicted) after the diffusion reaction with the metal, which is not necessarily a desirable or undesirable effect.)

Figure 2A:
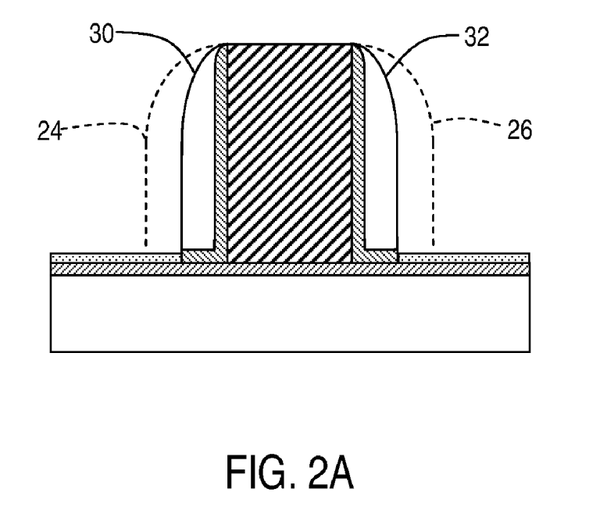
FIG. 2A is a cross-sectional view of the standard gate structure of the FET device of FIG. 1A after a sidewall spacer reduction process and prior to a silicidation process, and FIG.

Since the proximity value has an effect on the performance enhancing benefits of the silicide regions on the FET device and electrical resistance characteristics of the FET device, it can be beneficial to control the formation of the silicide regions to provide for an optimal proximity value. Since the standard gate structure of FIG. 1A may not result in such an optimal proximity value, it can be advantageous to perform a performance enhancing sidewall spacer reduction process in order to provide an optimal proximity value to the gate structure prior to a silicidation process. As can be seen in FIG. 2A, prior to reaching the cleaning and depositing system, a sidewall spacer reduction process can be performed to reduce the standard sidewall spacers (24, 26 from FIG. 1A shown in dotted lines) to reduced sidewall spacers 30, 32. Then the incoming stack with the gate structure of FIG. 2A is provided within the cleaning and depositing system, a pre-cleaning process is performed, and then a layer of metal used in the silicidation process (e.g., nickel) is deposited on top of the gate electrode and the substrate, and then a rapid thermal annealing process is performed on the gate structure to form the silicide regions 31, 33 and a silicide cap 34.

Figure 2B:
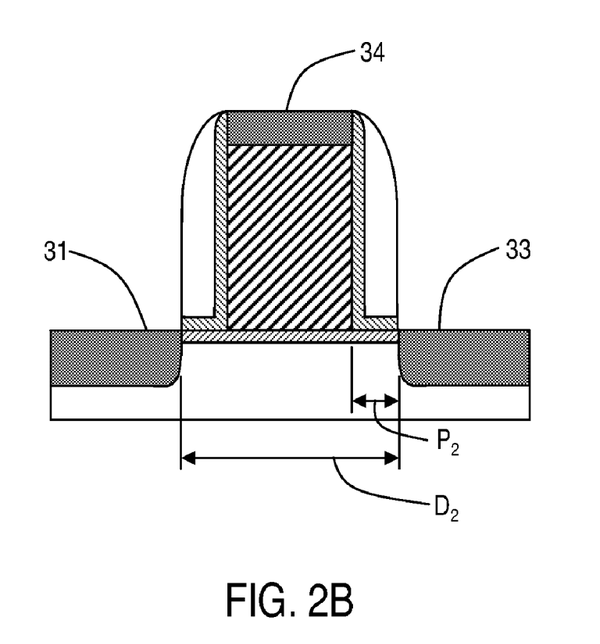

As can be seen in FIG. 2B, since the reduced sidewall spacers 30, 32 have reduced profiles, the silicide regions 31, 33 formed using the reduced sidewall spacers 30, 32 are separated by a distance $D_2$, which is less than $D_1$. Further, the silicide regions 31, 33 formed in this manner have a proximity value $P_2$, which is controlled through the formation of the reduced sidewall spacers and/or the silicidation process recipe to provide an optimal or substantially optimal proximity value.

One such sidewall spacer reduction process used to reduce spacer size to increase NMOS device performance due to tensile silicide stress effects is to use hydrofluoric acid with ethylene glycol (HFEG) to wet etch the sidewall spacer, typically used for high dose source/drain well ion implantation, down to an optimal size before silicidation. Following the HFEG clean process, the wafers proceed through a series of wet cleans that can include an RCA-like pre-clean and diluted HF. The resulting gate structure would resemble the gate structure in FIG. 2A. However, there are several problems associated with using HFEG to perform a sidewall spacer reduction process, for example, ethylene glycol is a toxic wet chemical that raises environmental concerns, HFEG can erode n-type polysilicon near n/p silicon junctions, performance of the process varies with bath age, the process is susceptible to metal ion contamination, and it adds consumable/disposal costs to the silicide pre-clean process in the cleaning and depositing system. Thus, a sidewall spacer reduction process using HFEG creates several yield limiting factors.

Figure 3A:
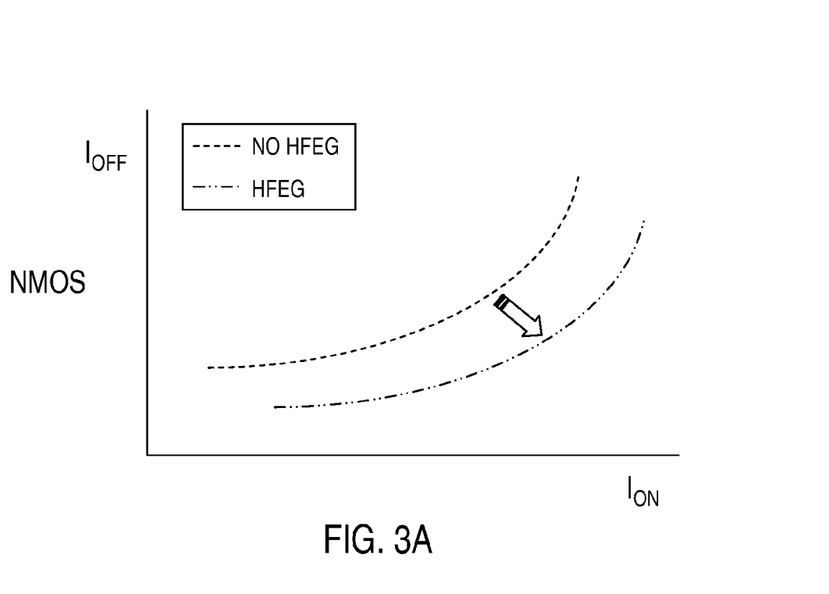
FIG. 3A is a universal performance curve of an NMOS device formed without sidewall spacer reduction, as compared to an NMOS device formed with sidewall spacer reduction using a wet etch of hydrofluoric acid with ethylene glycol (HFEG) and having enhanced performance.
Figure 3B:
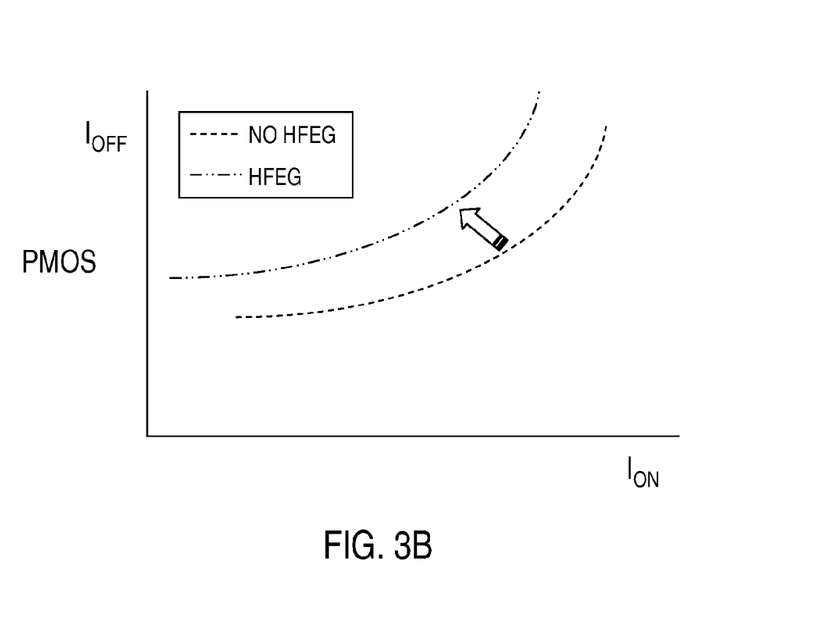
FIG. 3B is a universal performance curve of a PMOS device formed without sidewall spacer reduction, as compared to an PMOS device formed with sidewall spacer reduction using a wet etch of HFEG and having degraded performance.
Figure 4A:
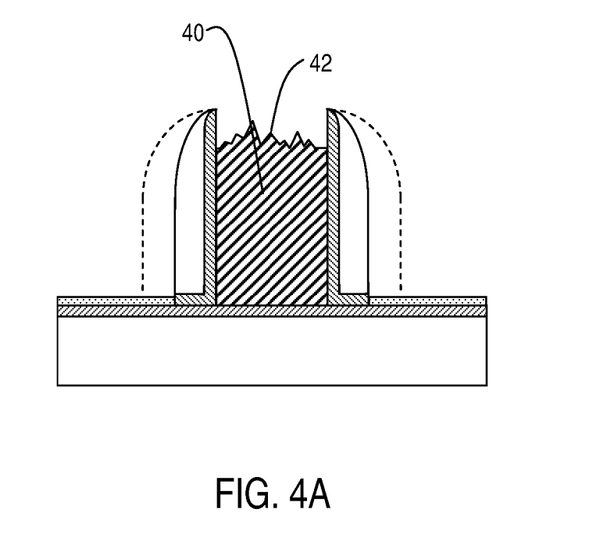
Figure 4B:
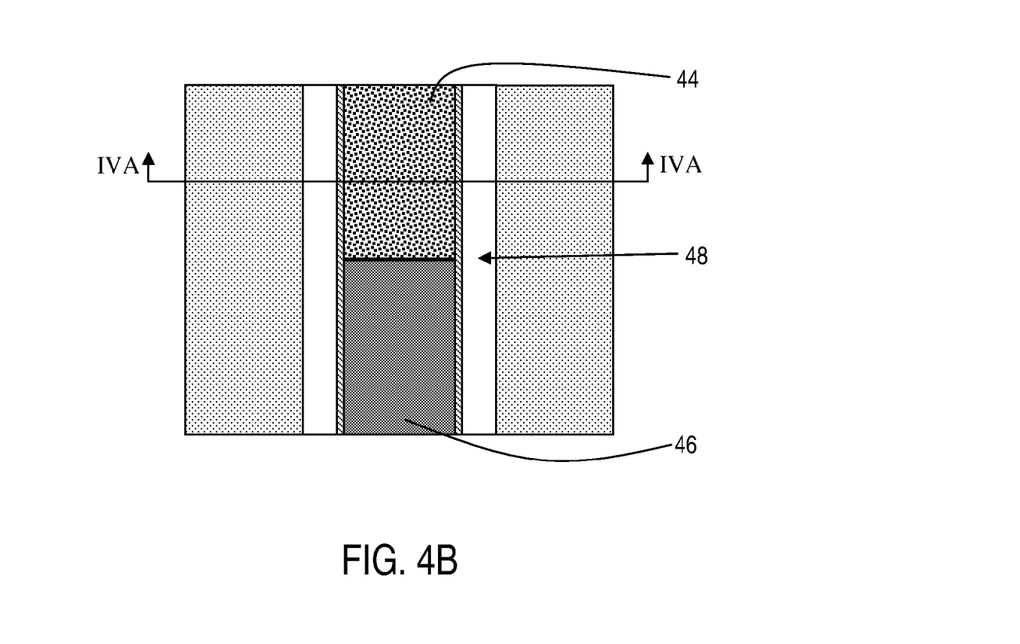

FIG. 3A is a universal performance curve of an NMOS device, and FIG. 3B is a universal performance curve of a PMOS device. FIG. 3A shows that the performance of the NMOS device can be improved using the HFEG sidewall spacer reduction process (as compared to a curve showing no HFEG sidewall spacer reduction process used) due to the tensile stress effects on the channel thereof due to improved silicide proximity. However, FIG. 3B shows that the performance of the PMOS device will actually be degraded by using the HFEG sidewall spacer reduction process (as compared to a curve showing no HFEG sidewall spacer reduction process used), for example, due to erosion of n-type polysilicon near n/p silicon junctions. As can be seen in FIGS. 4A and 4B, HFEG can erode n-type polysilicon of the gate electrode 40, which results in the eroded upper surface 42 of n-type polysilicon 44 at locations near an n/p silicon junction 48, while the p-type polysilicon 46 does not suffer from such affects.

Figure 5A:
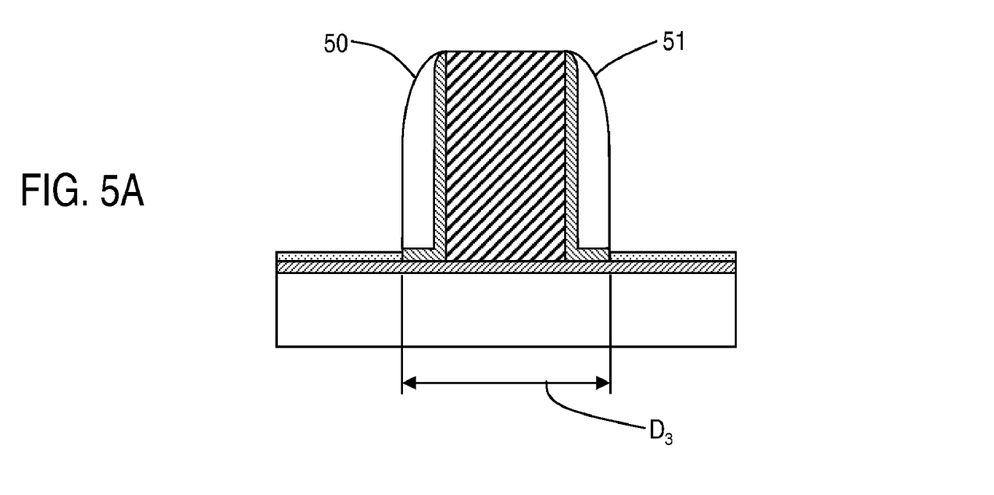
Figure 5B:
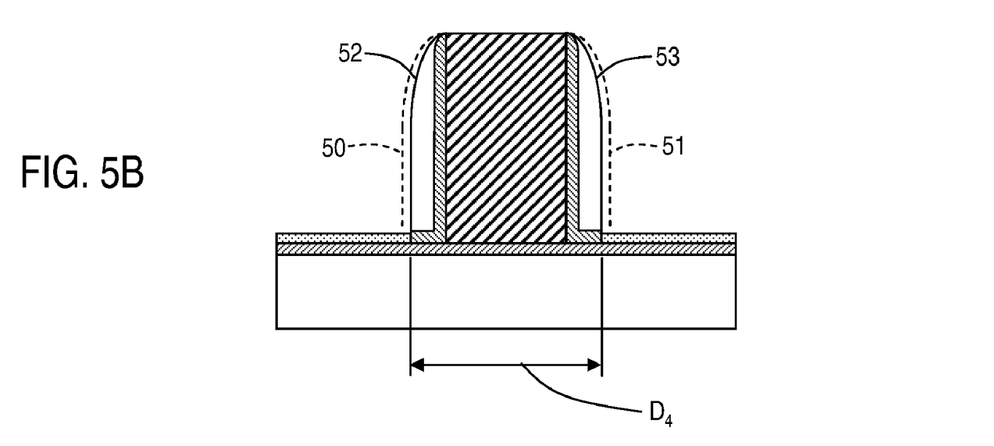
Figure 5C:
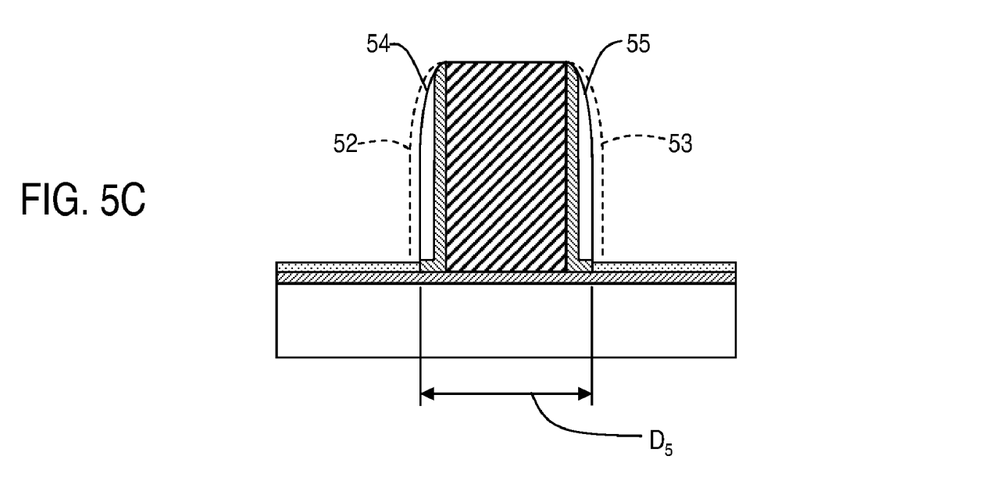

In such an HFEG sidewall spacer reduction process, a bath of HFEG is used to wet etch the sidewall spacers; however, the performance of the process varies with bath age, for example, the etch rate will vary with bath age. As can be seen in FIGS. 5A-5C, as the etch rate of the HFEG bath varies with bath age, the amount of sidewall spacer removed during the process will vary, which will impact the proximity of the silicide to the channel and its inherent stress benefits. For example, when the age of the bath is low, the HFEG process may produce sidewall spacers 50, 51 that have outer wall profiles separated by a distance $D_3$. However, as the age of the bath increases, the HFEG process may produce sidewall spacers 52, 53 that have outer wall profiles separated by a distance $D_4$, and, as the age of the bath increases even further, the HFEG process may produce sidewall spacers 54, 55 that have outer wall profiles separated by a distance $D_5$, where $D_3 > D_4 > D_5$. This naturally leads to product yield fluctuations, which can sometimes be extremely severe and are absolutely undesirable in a production environment. Thus, the HFEG process requires frequent bath changes to maintain etch rate performance; however, there is not believed to be a known method for monitoring the health of the HFEG bath, and thus it is difficult to maintain high yields.

Figure 6:
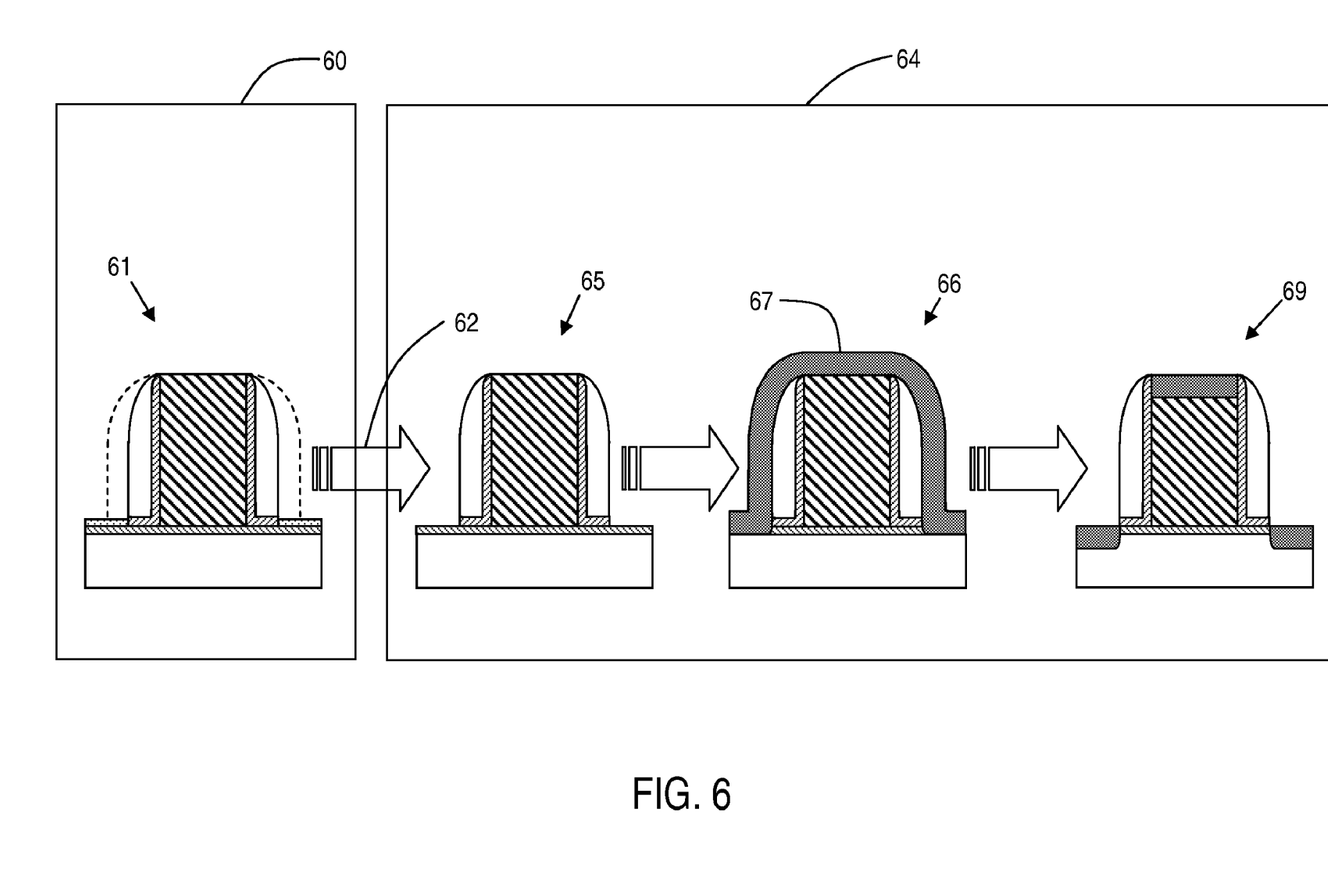
FIG. 6 depicts a manufacturing process of a gate structure at various stages along the manufacturing process, where the manufacturing process include an HFEG wet etch process to reduce sidewall spacer size prior to silicidation.

Also, the HFEG process for tailoring the sidewall spacer width is performed in a separate process module outside of a vacuum, thereby permitting native oxide to grow and defects to occur during wafer/lot transportation. For example, as can be seen in FIG. 6, the HFEG process is performed in a separate module that contains a wet bath system 60, which results in the post-HFEG gate structure 61 on the wafer. The wafer including the post-HFEG gate structure 61 is then transported (see arrow 62) to a separate module that has a vacuum system, 64, within which a cleaning process and a depositing process are performed. Thus, in the vacuum system 64 a pre-cleaning process is performed, which removes oxide (e.g., oxide layer 14 discussed with respect to FIG. 1A) and results in gate structure 65, and then a depositing process is performed that results in gate structure 66 having a nickel layer 67 deposited over the gate structure. The wafer can then be further processed, such as, by rapid thermal annealing to form the gate structure 69 having silicide regions and a silicide cap, and the wafer can then be transported out of the vacuum system 64. Thus, the use of separate wet bath system 60 and the separate vacuum system 64 disadvantageously permits native oxide to grow and defects to occur during wafer/lot transportation at arrow 62. Also, breaking the vacuum before silicidation can result in lower quality silicide or a compromise in ion implantation location.

Embodiments of the present invention provide numerous advantages over other processes used to enhance the performance of FET devices. For example, embodiments of the invention allow for the sizing of the sidewall spacers for maximum NMOS device performance before the formation of silicide without degrading the PMOS transistor performance. Also, embodiments of the invention provide such benefits without introducing additional tool overhead, suffering from yield variation, suffering from etch rate variation, raw consumable cost, toxic chemical disposal cost, or a significant increase in process cost as with the HFEG process.

Embodiments of the present invention advantageously utilize a cleaning and deposition system, which is used during the silicidation preparation process, to perform a sidewall spacer reduction process.

Figure 7:
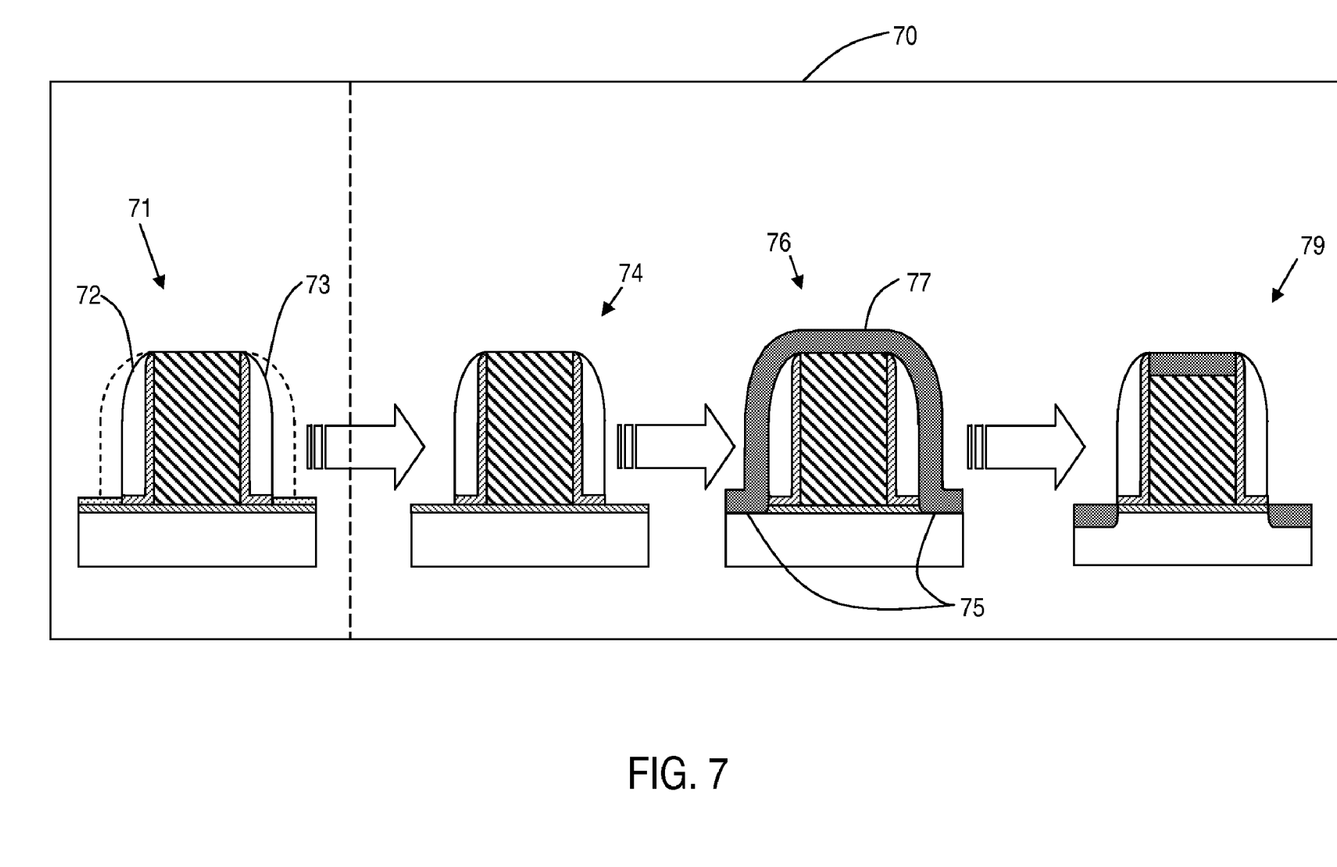
FIG. 7 depicts a manufacturing process of a gate structure at various stages along the manufacturing process according to an embodiment of the present invention, where the manufacturing process includes a dry etch process to reduce sidewall spacer size that is performed in a continuous vacuum system prior to silicidation.

FIG. 7 depicts an embodiment of the invention that transforms a cleaning and deposition system used during silicide formation, to also perform a sidewall spacer reduction process not previously contemplated. Thus, this embodiment transforms an in-situ cleaning and deposition system, optimized for silicide formation, with $NF_3/NH_3$ source gases into a highly controlled isotropic nitride/oxide etch process. The clean system is typically operated with high selectivity to nitride and has not previously been considered for nitride etching, such as etching of nitride spacers.

Figure 8:
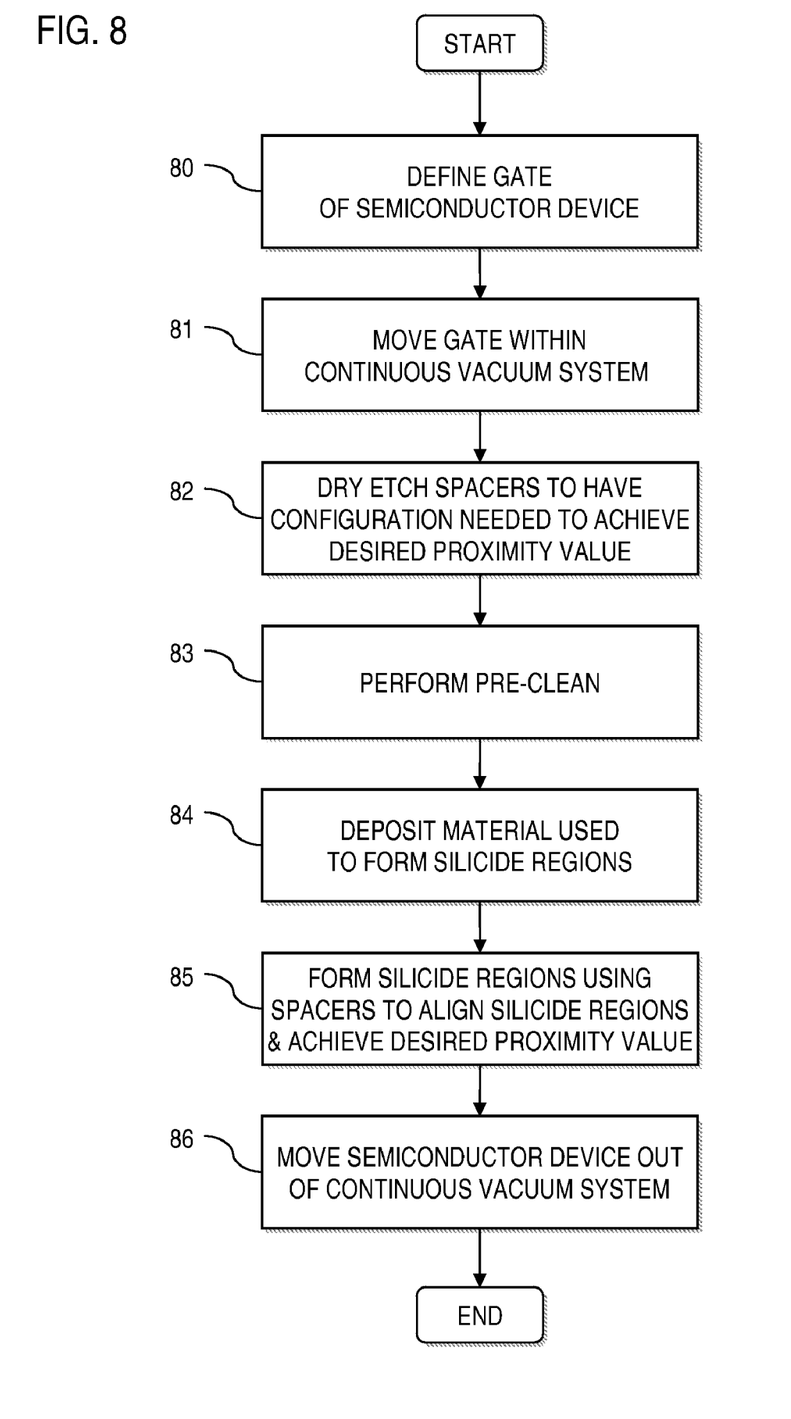
FIG. 8 depicts a flowchart of a manufacturing process of a gate structure according to an embodiment of the present invention, where the manufacturing process includes a dry etch process to reduce sidewall spacer size that is performed in a continuous vacuum system prior to silicidation.

As shown in FIGS. 7 and 8, a wafer containing the standard gate structure (e.g., as shown in FIG. 1A), which is formed using one or more modules, is transported to a module 70 defining a continuous vacuum system, for example, an Applied Material Siconi™ Preclean chamber. A sidewall spacer reduction process is performed on the standard gate structure within the continuous vacuum system of module 70, which results in a gate structure 71 having reduced sidewall spacers 72, 73 on the wafer. The wafer including the gate structure 71 is maintained within the continuous vacuum system of the module 70, and then a pre-cleaning process is performed, which removes oxide (e.g., oxide layer 14 discussed with respect to FIG. 1A) and results in gate structure 74. The wafer including the gate structure 74 is maintained within the continuous vacuum system of the module 70, and a depositing process, such as nickel deposition, is performed that results in gate structure 76 having a nickel layer 77 deposited over the gate structure, spacers and substrate. The wafer is then further processed, such as, by rapid thermal annealing, such that the silicon underlying the nickel layer is converted into nickel silicide, to a depth set by a thickness of the nickel layer and a silicidation temperature, to form the gate structure 79 having silicide regions (in the active regions of the substrate) and a silicide cap.

FIG. 8 sets forth a flowchart of the process shown in FIG. 7. In step 80, a gate structure is defined, and the gate structure is moved within the continuous vacuum system 70 in step 81. In step 82, the sidewall spacers are dry etched from the size shown using dotted lines in FIG. 7 to spacers 72, 73 to have a configuration needed to achieve a desired proximity value of the final silicide regions to the gate electrode. As the sidewall spacers 72, 73 will act as a mask to define an inner edge of silicide regions, the spacers 72, 73 should be formed to have a configuration that will result in the desired optimal proximity. In step 83, a pre-cleaning process is performed. The pre-clean process can be used to remove exposed oxide. In step 84, a layer of material that is used to form the silicide regions is formed, for example, nickel layer 77 is deposited on the gate structure, spacers, and active region of the substrate as depicted in FIG. 7. The gate structure is then further processed in step 85, such as by a rapid thermal annealing process for nickel silicidation and removal, to achieve the gate structure 79 having silicide regions. During the formation of the silicide regions in this manner, the spacers 72, 73 align the inner edges of the silicide regions to achieve the desired proximity value. The gate structure can then be moved out of the continuous vacuum system 70 in step 86 for further processing.

Thus, this embodiment advantageously utilizes a cleaning and depositing system to isotropically dry etch the nitride sidewall spacer(s), in a novel process flow and etch process regime. This embodiment of the invention makes it possible to combine the performance enhancing sidewall etch with the silicide pre-clean in a single uninterrupted flow. FIG. 7 illustrates how vacuum integrity is advantageously preserved during sidewall spacer reduction and the pre-silicide clean. Thus, the embodiment provides a sidewall spacer etch process that provides performance enhancement of the FET by providing optimal proximity of silicide regions by using an in-situ cleaning and deposition system, thus eliminating the need for and problems associated with an outside etch process.

The present invention further includes embodiments that include matching nitride film characteristics with process parameters to achieve a desired spacer pull back for optimal silicide proximity. Table 1 below sets forth some of the process parameters and films that can be changed to optimize oxide and nitride etch rates. Such changes can include, but are not limited to, $NF_3$ flow and temperature settings. Also, pressure and gas species can also be changed to deliver desired selectivities. Thus, the reduction of the sidewall spacers and the pre-cleaning processes can be optimized to provide the desired optimal proximity.

TABLE 1

| | PARAMETER CHANGE | OXIDE ETCH RATE | NITRIDE ETCH RATE |
|---|---|---|---|
| PRESSURE | INCREASE | DOWN | UP |
| TEMPERATURE | INCREASE | SLIGHTLY UP | UP |
| GAS SPECIES   $NF_3$ | INCREASE | UP | UP |
| $NH_3$ | INCREASE | UP | DOWN |
| Ar | INCREASE | UP | DOWN |
| RF POWER | INCREASE | UP | UP |
| GAS FLOW RATE | INCREASE | UP | UP |
| BIAS POWER | INCREASE | UP | SLIGHTLY UP |
| NITRIDE OR OXIDE FILM COMPOSITION | INCREASE H | UP | UP |

Figure 9:
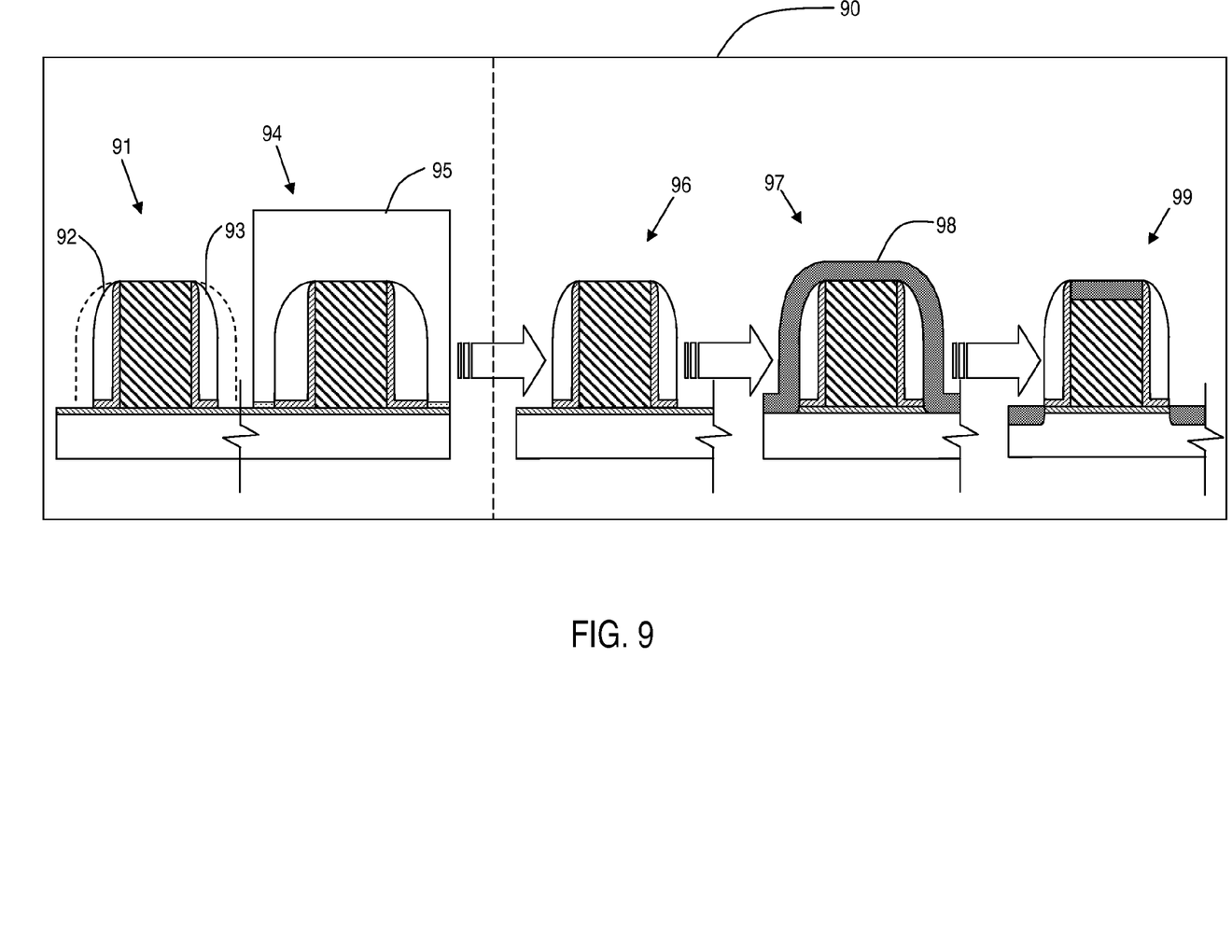
FIG. 9 depicts a manufacturing process of gate structures at various stages along the manufacturing process according to an embodiment of the present invention, where the manufacturing process includes a dry etch process to reduce sidewall spacer size of an NMOS device that is performed in a continuous vacuum system prior to silicidation, and where a PMOS device has photoresist thereon during the dry etch.

Further embodiments of the invention include patterning the PMOS transistors with photoresist prior to the isotropic dry etch to lessen PMOS degradation from close proximity silicide. For example, as shown in FIG. 9, a wafer containing a gate structure for an NMOS transistor and a gate structure for a PMOS transistor is transported to a module 90 defining a continuous vacuum system. In this embodiment, the PMOS transistor transported to the module 90 is patterned with a photoresist material. Once in the continuous vacuum system of module 90, the sidewall spacer reduction process is performed on the NMOS transistor, which results in a gate structure 91 having reduced sidewall spacers 92, 93 on the wafer. Since the gate structure 94 of the PMOS transistor is patterned with a photoresist material 95, the etching of the NMOS transistor does not degrade the performance of the PMOS transistor. The wafer, which includes the NMOS gate structure 91 and the PMOS gate structure 94, is maintained within the continuous vacuum system of the module 90, and then a pre-cleaning process is performed on the NMOS gate structure as shown (or alternatively performed on both the NMOS gate structure and the PMOS gate structure), which removes oxide (e.g., oxide layer 14 discussed with respect to FIG. 1A) and results in gate structure 96. The wafer is maintained within the continuous vacuum system of the module 90, and a depositing process, such as nickel deposition, is performed that results in NMOS gate structure 97 (or alternatively also performed on the PMOS gate structure) having a nickel layer 98 deposited over the gate structure, spacers and substrate. The wafer is then further processed, such as, by rapid thermal annealing, such that the silicon underlying the nickel layer is converted into nickel silicide, to a depth set by a thickness of the nickel layer and a silicidation temperature, to form the NMOS gate structure 99 (or alternatively also performed on the PMOS gate structure) having silicide regions (in the active regions of the substrate) and a silicide cap.

Figure 10:
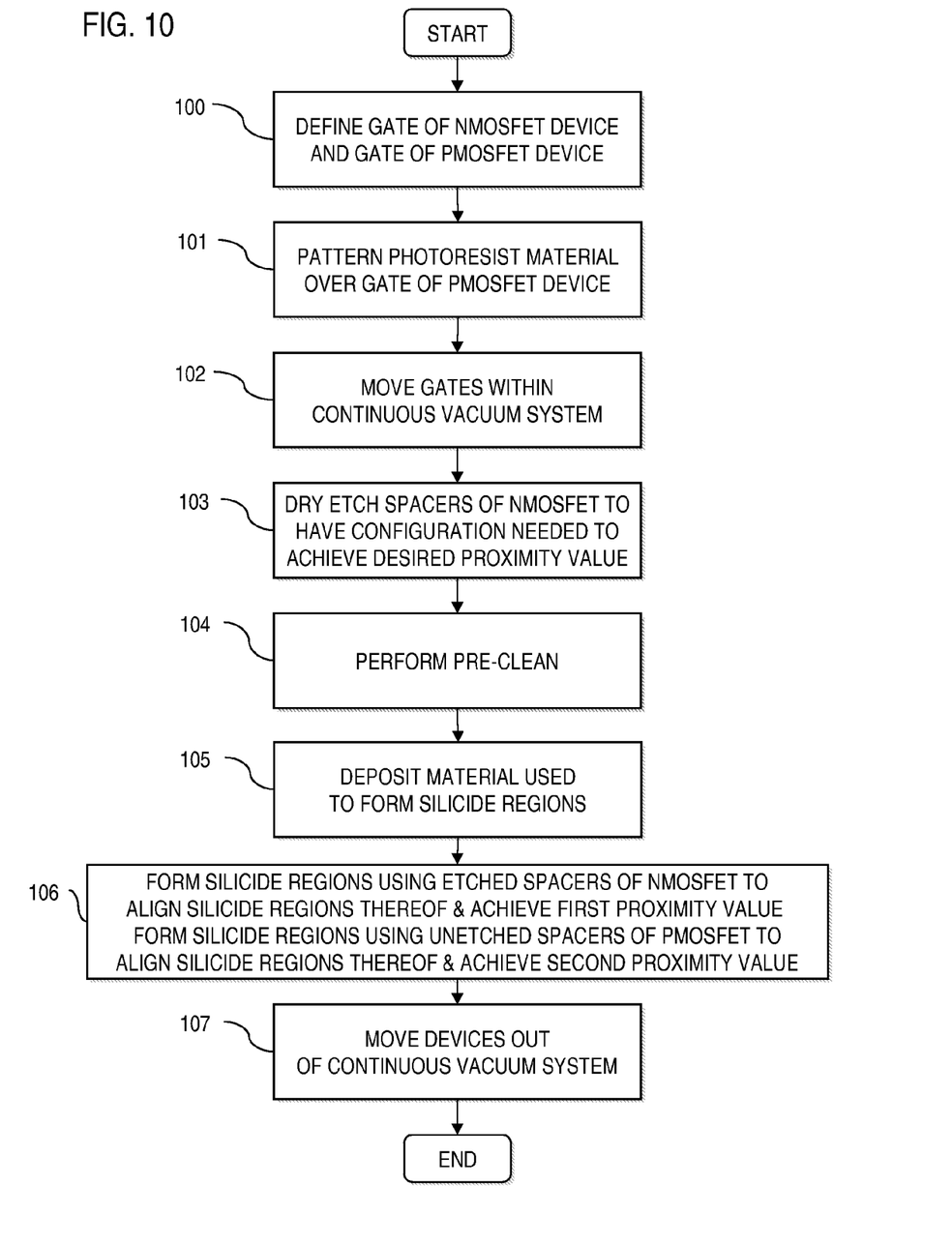
FIG. 10 depicts a flowchart of a manufacturing process of gate structures according to an embodiment of the present invention, where the manufacturing process include a dry etch process to reduce sidewall spacer size that is performed in a continuous vacuum system prior to silicidation, and where a PMOS device has photoresist thereon during the dry etch.

FIG. 10 sets forth a flowchart of an embodiment of a process similar to that discussed above with respect to FIG. 9. In step 100, a gate structure of a PMOSFET device is defined, and a gate structure of an NMOSFET device is defined. A photoresist material is patterned on the PMOSFET device in step 101. In step 102, the gate structures are moved within the continuous vacuum system 90. In step 103, the sidewall spacers of the NMOSFET device are dry etched from the size shown using dotted lines in FIG. 9 to spacers 92, 93 to have a configuration needed to achieve a desired proximity value of the final silicide regions to the NMOSFET gate electrode. In step 104, a pre-cleaning process is performed. The pre-clean process can be used to remove exposed oxide. Note that, due to the difference in sizes of the etched spacers 92, 93 of the gate structure 91 of the NMOSFET device and the unetched spacers of the gate structure 94 of the PMOSFET device, a proximity value for the NMOSFET device (i.e., a first proximity value) will be different from a proximity value for the PMOSFET device (i.e., a second proximity value) in such an embodiment. In step 105, a layer of material that is used to form the silicide regions is formed, for example, nickel layer 98 is deposited on the gate structures, spacers, and active regions of both devices. The gate structure is then further processed in step 106, such as by a rapid thermal annealing process for nickel silicidation and removal, to achieve the gate structures having silicide regions. During the formation of the silicide regions in this manner, the etched and unetched spacers align the inner edges of the silicide regions to the respective gate structure to achieve the desired proximity value. The gate structures can then be moved out of the continuous vacuum system 90 in step 107 for further processing.

Figure 11A:
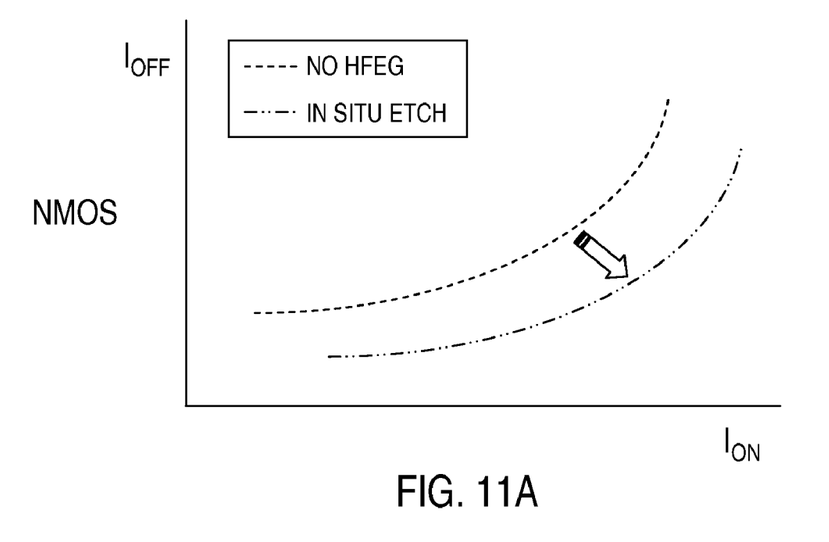
FIG. 11A is a universal performance curve of an NMOS device formed without sidewall spacer reduction using HFEG, as compared to an NMOS device formed with sidewall spacer reduction according to an embodiment of the invention and having enhanced performance.
Figure 11B:
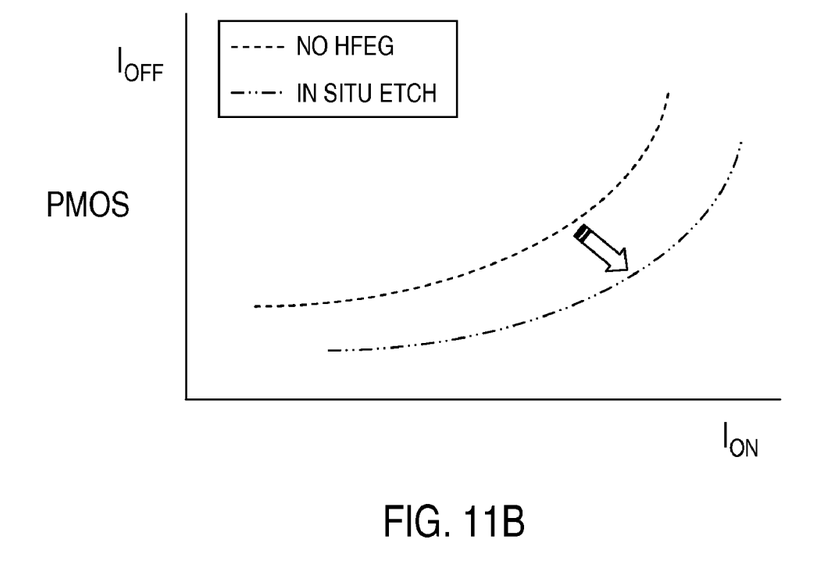
FIG. 11B is a universal performance curve of a PMOS device formed without sidewall spacer reduction using HFEG, as compared to an PMOS device formed with sidewall spacer reduction according to an embodiment of the invention and having enhanced performance.

As can be seen in FIGS. 11A and 11B, embodiments of the present invention provide processes that can be used to maximize NMOS device performance without degrading PMOS transistor performance. In fact, as shown in FIG. 11A, the universal performance curve of an NMOS device can be improved using the in-situ etch as compared to a situation where sidewall spacer reduction is not performed and without the need for an HFEG process and its associated problems process, and, as shown in FIG. 11B, the universal performance curve of a PMOS device can also be improved using the in-situ etch as compared to a situation where sidewall spacer reduction is not performed.

Embodiments of the invention advantageously provide the ability to tune oxide and nitride etch rates, which provides an FET manufacturer the freedom to modify sidewall spacer stack materials and maintain the ability to tailor the sidewall spacer, which can be very large to control in deep source drain implantation, and its inherent short channel effects with small gate lengths, in order to optimize the stress in the channel by silicide proximity after the canonical implantation has occurred.

The invention provides embodiments that provide numerous potential advantages over other sidewall spacer reduction methods. For example, embodiments of the invention allow film types and etch processes to be altered to tailor spacer offsets per device type and technology node (e.g., 65, 45, 32 nm). Additionally, embodiments of the invention provide for an in-situ process, which allows for a better quality silicide to be formed, since vacuum integrity is preserved between etch, clean, and silicidation. Also, embodiments of the invention allow closer proximity with no PMOS degradation, and allow for the possibility of differential proximity on the PMOS and NMOS devices. Furthermore, embodiments of the invention utilize dry etches, which can be controlled through oxide to nitride selectivity changes, and which are less likely to form pipes and patch defects resulting from wet etch processes. And, embodiments of the invention provide for the tailoring of dry etch parameters (e.g., gas flow rate, gas species, pressure, temperature, RF power, etc.) to the spacer film type for optimal spacer size. Further, embodiments of the invention take advantage of plasma stability, repeatability, and control, in order to ensure consistency from run to run. Embodiments of the invention also advantageously eliminate preferential etching of n-type silicon at n/p junctions. And, embodiments of the invention advantageously utilize an in-situ etch within a silicide cleaning and deposition system, which reduces process flow steps, cost, and variability.

It should be noted that the exemplary embodiments depicted and described herein set forth the preferred embodiments of the present invention, and are not meant to limit the scope of the claims hereto in any way. Numerous modifications and variations of the present invention are possible in light of the above teachings. It is therefore to be understood that, within the scope of the appended claims, the invention may be practiced otherwise than as specifically described herein.

What is claimed is:

1. A method comprising sequentially:
    forming a gate of a semiconductor device on a substrate;
    forming sidewall spacers, having a first size, on sides of the gate;
    etching the sidewall spacers to reduce the first size to a second size and to provide a proximity value, which is defined as a distance between the gate and an edge of a performance-enhancing region, wherein the sidewall spacers are used to define the edge of the region during formation of the region in the substrate; and
    pre-cleaning the gate and the substrate in preparation for formation of the region,
    wherein the etching and the pre-cleaning are performed in a continuous vacuum.

2. The method according to claim 1, wherein the performance-enhancing region is a silicide region.

3. The method according to claim 1, comprising dry isotropically etching to reduce the size of the sidewall spacers.

4. The method according to claim 1, comprising etching to reduce the size of the sidewall spacers and pre-cleaning in a silicidation pre-cleaning and deposition module.

5. The method according to claim 4, wherein the sidewall spacers are formed of nitride or silicon nitride.

6. The method according to claim 1, further comprising depositing a layer of material on the pre-cleaned gate and substrate, wherein the material is used to form the performance-enhancing region, and wherein the depositing is performed in the continuous vacuum.

7. The method according to claim 6, further comprising performing a silicidation process on the layer of material to form the performance-enhancing region, wherein the silicidation process is performed in the continuous vacuum.

8. The method according to claim 1, wherein the semiconductor device is an NMOSFET device.

9. The method according to claim 8, further comprising:
forming an additional gate of a PMOSFET device on the substrate; and
patterning a photoresist material over the PMOSFET device prior to etching of the sidewall spacers of the gate of the NMOSFET device,
wherein the photoresist material is over the PMOSFET device during etching of the sidewall spacers of the gate of the NMOSFET device.

10. The method according to claim 9, wherein:
the additional gate has sidewall spacers on sides thereof;
the sidewall spacers of the additional gate provide an additional proximity value, which is defined as a distance between the additional gate and an edge of an additional performance-enhancing region,
the sidewall spacers of the additional gate are used to align the additional region to provide the additional proximity value during formation of the additional region in the substrate; and
the proximity value of the gate of the NMOSFET device is different from the additional proximity value of the additional gate of the PMOSFET device.

11. A method comprising sequentially:
forming a gate of a semiconductor device on a substrate;
forming sidewall spacers, having a first size, on sides of the gate;
transporting the substrate to a process module;
reducing the size of the sidewall spacers from the first size to a second size within the process module;
pre-cleaning the gate and the substrate within the process module; and
forming silicide regions in the substrate,
wherein the sidewall spacers having the second size are used to define edges of the silicide regions, and
wherein reducing the size of the sidewall spacers and pre-cleaning are performed in a continuous vacuum in the process module.

12. The method according to claim 11, wherein the forming of the silicide regions includes depositing a layer of material on the pre-cleaned gate and substrate, and wherein the depositing is performed in the continuous vacuum in the process module.

13. The method according to claim 12, further comprising performing a silicidation process on the layer of material to form the performance-enhancing region, wherein the silicidation process is performed in the continuous vacuum in the process module.

14. The method according to claim 11, comprising dry isotropically etching to reduce the size of the sidewall spacers.

15. The method according to claim 14, wherein the sidewall spacers are formed of nitride or silicon nitride.

16. The method according to claim 11, wherein the semiconductor device is an NMOSFET device.

17. The method according to claim 16, further comprising:
forming an additional gate of a PMOSFET device on the substrate; and
patterning a photoresist material over the PMOSFET device prior to the reducing of the sizes of sidewall spacers of the gate of the NMOSFET device,
wherein the photoresist material is over the PMOSFET device during the reducing of the sizes of the sidewall spacers of the gate of the NMOSFET device.

18. The method according to claim 17, further comprising forming additional silicide regions in the substrate, wherein sidewall spacers of the additional gate of the PMOSFET device are used to define edges of the additional silicide regions.

19. The method according to claim 18, wherein:
the sidewall spacers of the NMOSFET device provide a first proximity value, which is defined as a distance between the gate of the NMOSFET device and edges of the silicide regions; and
the additional sidewall spacers of the PMOSFET device provide a second proximity value, which is defined as a distance between the additional gate of the PMOSFET device and edges of the additional regions.

20. The method according to claim 19, wherein the first proximity value is different than the second proximity value.

21. A method comprising:
forming a gate of an NMOSFET semiconductor device on a substrate;
etching sidewall spacers on sides of the gate to provide a proximity value, which is defined as a distance between the gate and an edge of a performance-enhancing region, wherein the sidewall spacers are used to define the edge of the region during formation of the region in the substrate; and
pre-cleaning the gate and the substrate in preparation for formation of the region, wherein the etching and the pre-cleaning are performed in a continuous vacuum, the method further comprising:
forming an additional gate of a PMOSFET device on the substrate; and
patterning a photoresist material over the PMOSFET device prior to etching of the sidewall spacers of the gate of the NMOSFET device,
wherein the photoresist material is over the PMOSFET device during etching of the sidewall spacers of the gate of the NMOSFET device.

22. The method according to claim 21, wherein:
the additional gate has sidewall spacers on sides thereof.

23. A method comprising:
forming a gate of an NMOSFET semiconductor device on a substrate;
reducing sizes of sidewall spacers on sides of the gate within a process module;
performing a pre-silicide clean of the gate and the substrate within the process module; and
forming silicide regions in the substrate,
wherein the sidewall spacers are used to define edges of the silicide regions, and wherein the reducing of sizes of the sidewall spacers and the performing of the pre-silicide clean are performed in a continuous vacuum in the process module, the method further comprising:
forming an additional gate of a PMOSFET device on the substrate; and
patterning a photoresist material over the PMOSFET device prior to the reducing of the sizes of sidewall spacers of the gate of the NMOSFET device,
wherein the photoresist material is over the PMOSFET device during the reducing of the sizes of the sidewall spacers of the gate of the NMOSFET device.

24. The method according to claim 23, further comprising forming additional silicide regions in the substrate, wherein sidewall spacers of the additional gate of the PMOSFET device are used to define edges of the additional silicide regions.

25. The method according to claim 24, wherein:
the sidewall spacers of the NMOSFET device provide a first proximity value, which is defined as a distance between the gate of the NMOSFET device and edges of the silicide regions; and
the additional sidewall spacers of the PMOSFET device provide a second proximity value, which is defined as a distance between the additional gate of the PMOSFET device and edges of the additional regions.

26. The method according to claim 25, wherein the first proximity value is different than the second proximity value.

* * * * *